United States Patent [19]

Moinpour et al.

[11] Patent Number: 5,725,414
[45] Date of Patent: Mar. 10, 1998

[54] APPARATUS FOR CLEANING THE SIDE-EDGE AND TOP-EDGE OF A SEMICONDUCTOR WAFER

[75] Inventors: Monsour Moinpour, Cupertino; Ilan Berman, Sunnyvale; Young C. Park, Mountain View, all of Calif.

[73] Assignee: Intel Corporation, Santa Clara, Calif.

[21] Appl. No.: 777,519

[22] Filed: Dec. 30, 1996

[51] Int. Cl.⁶ .................................................. B24B 1/00
[52] U.S. Cl. .................................. 451/41; 451/44; 451/63; 15/88.3; 15/77
[58] Field of Search ........................... 451/41, 44, 63, 451/62, 66, 103, 105, 131, 172, 188, 207, 301; 15/88.3, 77

[56] References Cited

U.S. PATENT DOCUMENTS

| | | | |
|---|---|---|---|
| 4,027,686 | 6/1977 | Shortes et al. | 134/33 |
| 4,326,553 | 4/1982 | Hall | 134/153 |
| 5,350,428 | 9/1994 | Leroux et al. | 29/25.01 |
| 5,351,360 | 10/1994 | Suzuki et al. | 15/77 |

*Primary Examiner*—Robert A. Rose
*Assistant Examiner*—George Nguyen
*Attorney, Agent, or Firm*—Blakely, Sokoloff, Taylor & Zafman

[57] ABSTRACT

An apparatus for cleaning the side-edge and top-edge of a semiconductor wafer. The present invention provides an edge cleaning mechanism that cleans both the side-edge and top-edge of a wafer based on friction and/or a difference in tangential velocity at a point of contact between the wafer and the cleaning mechanism.

11 Claims, 3 Drawing Sheets

5,725,414

APPARATUS FOR CLEANING THE SIDE-EDGE AND TOP-EDGE OF A SEMICONDUCTOR WAFER

FIELD OF THE INVENTION

The present invention relates to the field of semiconductor wafer processing; more particularly, the present invention relates to cleaning the edges and/or bevel areas of semiconductor wafers.

BACKGROUND OF THE INVENTION

Semiconductor manufacturers use semiconductor wafers as the base for manufacturing integrated circuits. In one step of the manufacturing process, the wafers are put through chemical mechanical polishing (CMP). CMP is becoming the main planarization technology for both dielectric and metal layers. For the CMP of dielectric layers, such as BPSG, BPTEOS, and PECVD Oxides (often referred to as the ILD0, ILD1, ILD2 . . . layers, respectively), a fumed silica-based slurry is normally used. Other slurries, such as dispersed silica, fumed or dispersed alumina, are also being used for CMP of both oxides and metals (such as tungsten (W), copper (Cu), aluminum (al), and titanium (Ti)). When the CMP process is completed, the wafers' surfaces are covered in particles, referred to as a slurry residue. At later steps in the process flow, some of this slurry residue is redistributed across the front of the wafer, thereby resulting in a loss in die yield and/or device performance. To prevent the slurry redistribution, all surfaces of a wafer must be free of contamination.

Different post CMP cleaning methods have been introduced in the last few years. These include cleaning the wafers in wet stations using conventional wet cleaning methods, such as SC1, HF and megasonic cleaning. Other cleaning methods in use are based on scrubbing wafers with brushes of various kinds and configurations using DI water or a combination of DI with chemicals such as Ammonia and Citric acid.

One system used to remove wafer contaminants is a double sided scrubber. In a double sided scrubber, a semiconductor wafer is scrubbed simultaneously on both sides by brushes. Since the wafer is being scrubbed simultaneously on both sides by the brushes, there must be a way of holding the wafer in place and rotating the wafer so the entire surface of the wafer is cleaned. A mechanism used for this purpose is commonly referred to as a roller.

Today, double sided scrubbers are usually automated and comprise a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof. FIG. 1 illustrates a conventional double sided wafer scrubber. Referring to FIG. 1, a wafer 102 is being scrubbed by brushes, one of which is shown as brush 110 and the other being beneath wafer 102 and directly below brush 110. Rollers 108 rotate wafer 102 so the wafer surface may be cleaned. Each of brushes 110 is rotated about its central axis by a motor 106. The rotary motion of rollers 108 is then transferred to wafer 102 when the edge of each of rollers 109 comes into contact with the outer edge of wafer 102.

Although conventional brush cleaning systems can clean the major surfaces of semiconductor substrates, such systems fail to provide a sufficient amount of mechanical energy at the outer periphery of the top and/or bottom surfaces of the wafer to remove contamination. Conventional brush cleaning systems also fail to provide a sufficient amount of mechanical energy to remove slurry and other contaminates from the side-edge of the wafer.

One approach that has been used to address the problem associated with the removal of slurry from the edge of a wafer is described in copending application Ser. No. 08/640,459, filed May, 1, 1996, which is assigned to the present assignee. The prior art approach for cleaning contaminates from the edge or bevel region of a wafer uses a scrubbing mechanism. One problem associated with scrubbing method is that the scrub pad used to clean the wafer edge may not adequately clean contaminates embedded within crevices formed along the outer periphery of the top surface of the wafer. For example, the prior art scrubbing method may not fully remove contaminates within the scribe marks or notches located at or near the top-edge of the wafer along the outer periphery of the top-side surface.

What is needed then is a method and apparatus for cleaning contaminates from the top-edge and side-edge of a semiconductor wafer.

SUMMARY OF THE INVENTION

An apparatus for cleaning the side-edge and top-edge of a substrate, such as a semiconductor wafer, is described. The present invention provides an edge cleaning mechanism that cleans both the side-edge and top-edge of a wafer based on friction and/or a difference in tangential velocity at a point of contact between the wafer and the cleaning mechanism.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

An apparatus for cleaning the side-edge and top-edge of contaminated substrates is described. The cleaning process may be used in double sided scrubber systems or other systems, such as, for instance, chemical mechanical polishing systems or flat panel display manufacturing systems. In the following description, numerous specific details are set forth such as rotation speeds, chemicals, pressures, etc., in order to provide a thorough understanding of the present invention. It will be apparent, however, to one skilled in the art that the present invention may be practiced without these specific details. In other instances, well-known components, structures and techniques have not been shown in detail in order to avoid obscuring the present invention.

The present invention provides an apparatus that cleans the top-edge and side-edge of semiconductor wafers, including the bevel area when present. In the present invention, particles are removed from the top-side edge and side-edge and/or bevel area using an edge scrubbing mechanism that may be incorporated into a scrubber tool.

Although the present invention is described in conjunction with the scrubbing of a wafer, it will be appreciated that any similarly shaped, i.e. generally flat, substrate, may be processed by the methods and apparatuses of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, two or multiple substrates bonded to each other, or substrates for processing other apparatuses and devices such as flat panel displays, multichip modules, etc.

Figure 1:
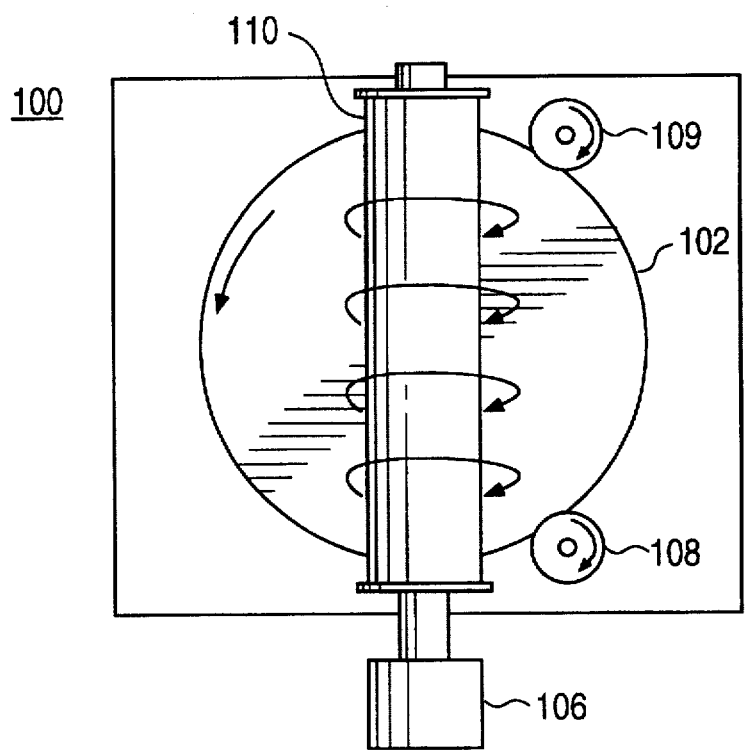
FIG. 1 illustrates a conventional double sided wafer scrubber.
Figure 2:
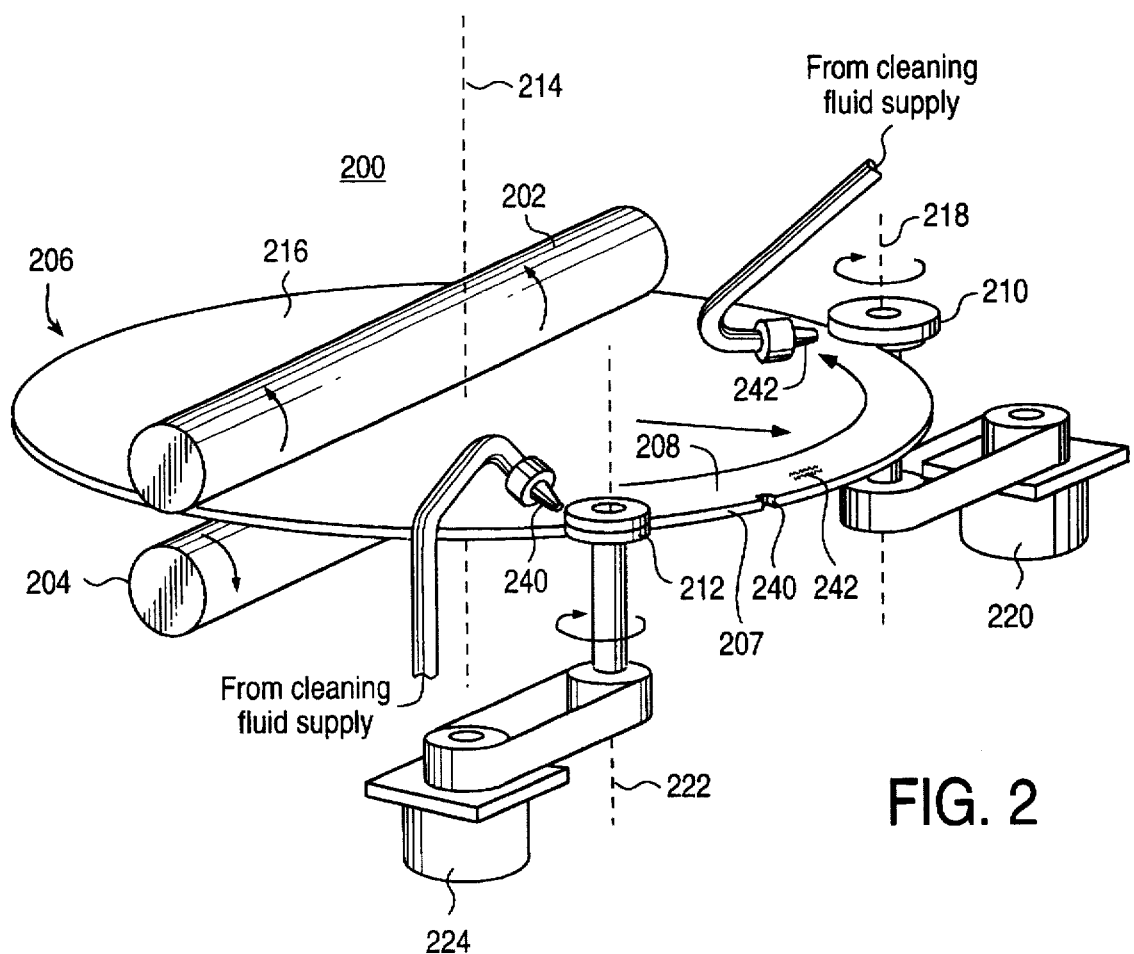
FIG. 2 illustrates a perspective view of a top-edge and side-edge cleaning apparatus in accordance with one embodiment of the present invention.
Figure 3:
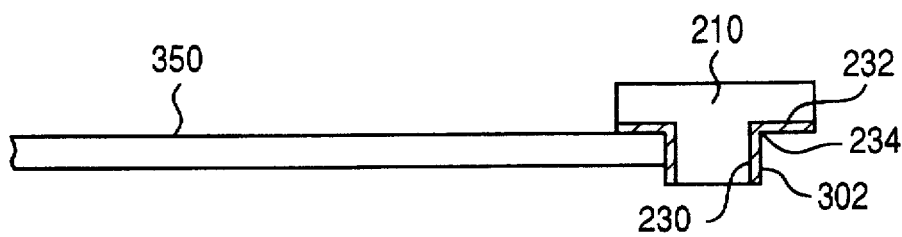
FIG. 3 illustrates a side-section view of a pad and roller combination used for scrubbing the top-edge and side-edge of a wafer.

FIG. 2 illustrates a double sided scrubber 200 having a top-side brush 202 and a bottom-side brush 204 for cleaning the top and bottom surfaces of a wafer 206. Two rollers, 210 and 212, are used to rotate the wafer about an axis of rotation 214, the axis of rotation 214 being perpendicular to the surface 216 of wafer 206. Roller 210 is rotated at a first speed about a first axis of rotation 218 by motor 220, wherein roller 212 is rotated at a second speed about a second axis of rotation 222 by motor 224. Axes 218 and 222 are oriented in a parallel relationship to axis 214. In accordance with the present invention at least one roller is configured to clean both the side-edge and top-edge of the wafer. For example, as shown in FIG. 3, in one embodiment roller 210 includes a cylindrical surface 230 that is coaxial with axis of rotation 218, and a second surface 232 that is substantially perpendicular to cylindrical surface 230. A corner 234 is formed at the juncture of surfaces 230 and 232. Surfaces 230 and 232 may be textured to facilitate the cleaning the side-edge 207 and top-edge 208 of wafer 206. Alternatively, abrasive pads may be attached to surfaces 230 and 232. It is appreciated that roller 212 may also be configured to clean edges 207 and 208, and, as such, may include the same features of roller 210. Note that FIGS. 2 illustrates only an exemplary configuration and other configurations are possible.

The rotating motion of rollers 210 and 212, and the friction that is created between the roller and edge surfaces, cause wafer 206 to rotate. The rotation of wafer 206 between rotating brushes 202 and 204 facilitate the cleaning of the wafer's top and bottom major surfaces. However, as previously discussed, brushes 202 and 204 do not adequately clean contaminates from the scribed and/or notched areas 240 and 242 that are located along the outer periphery of the wafer's top surface 216. Cleaning of side-edge 207 and top-edge 208 is accomplished due to friction and the difference in tangential velocity at the points of contact between roller surfaces 230 and 232 and edges 207 and 208. The difference in tangential velocity is produced by rotating rollers 210 and 212 at different speeds.

In one embodiment, roller 210 rotates at 40 revolutions per minute (rpm), while roller 212 rotates at 60 rpm. In this manner, the ratio of rotational speeds between rollers 210 and 212 is 1.5, or a ratio that is approximate thereto. In alternate embodiments, the rotational speed of roller 210 may be 10–15% less than the rotational speed of roller 212. Note that any difference between rotation speeds of the wafer and the roller may be used to clean edge areas 207 and 208.

To enhance particle removal, roller 210 includes a pad made of an abrasive (e.g., nylon, PVA, polyurethane, etc.). FIG. 3 illustrates one embodiment of roller 210 with pad 302. An exemplary wafer 350 is also shown. In one embodiment, pad 302 comprises a SubaIV pad manufactured by Rodel of Newark, Del. Other abrasive pads such as IC1000, suba500, politex (all manufactured by Rodel) can also be used.

Figure 4:
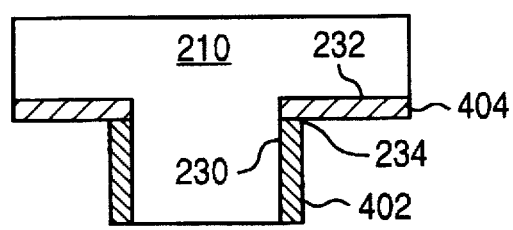
FIG. 4 illustrates a side-section view of another pad and roller combination used for scrubbing the top-edge and side-edge of a wafer.

Note that the pad can be of different thickness and surface texture to increase and/or even maximize the cleaning action. As shown in FIG. 4, two separate pads 402 and 404, each having a different thicknesses and/or surface texture than the other, may be attached to roller surfaces 230 and 232 to maximize the overall scrubbing ability of the roller. For example, the thickness of pad 404 may be varied according to the depth of the scribe marks or the size of the notches located within the wafer.

One benefit of the present invention is that through the combination of the edge scrubbing mechanism and the top and bottom brushes all of the exposed areas of the wafer which may be contaminated with slurry particles are cleaned. This includes the top surface, bottom surface, side-edge and top-edge of the wafer.

To further facilitate particle removal, water jets 240 and 242 may be used to propel water into or near the point of contact between rollers 210 and 212 and the wafer, such as shown in FIG. 2. Such water jets may be positioned such that the direction of water flows from a plane aligned with the rotational axis of the wafer and contact points between the wafer and the side scrubbing mechanism. In such a case, the water may simply carry the particles away that are removed from the wafer by the side scrubbing mechanism or may, if at sufficient pressure, cause removal of particles by itself. The water jet can also act as pad conditioning when it is directed toward the side scrubbing mechanism. Although two jets are shown, only one jet may be used to help facilitate particle removal. Note that the water jets are held in place by support structures which are well-known in the art. In one embodiment, the water jets are held in place above the wafer. Such a jet may be as simple as a barbed coupling with reducing barb to increase the velocity of the created stream. In one embodiment, the barbed coupling is $\frac{1}{8}$" to $\frac{1}{16}$" in diameter. In another embodiment, the jet may include a nozzle that produces a fanned, knife edge pattern. Water jets are well-known in the art. Note also that jets that spray other chemicals may be used, instead of water, to facilitate particle removal.

The pad may be cleaned occasionally to remove build-up of particles. The side scrubbing mechanism of the present invention may be self-cleaning. In one embodiment, the side scrubbing mechanism may flow DI water or a combination of DI water and a chemical such as $NH_4OH$ or $NH_4OH/H_2O_2$ mixture through itself. In an alternate embodiment, the side scrubbing mechanism may be self-cleaning by spraying DI or a combination of DI and a chemical such as $NH_4OH$ or $NH_4OH/H_2O_2$ onto it during substrate cleaning to reduce build-up. In cases where water is used, manual or self-cleaning is generally not required, but may be used.

The present invention may be used for post CMP of both oxide and metal, including, but not limited to, layers of W, Ti, Al, or Cu. However, the present invention is not limited to use in CMP applications. Also, the present invention may be extended to accommodate all substrate sizes in the future.

Furthermore, the present invention is easily integrated into existing post-CMP scrubber technologies. That is, wafers (e.g., dielectric, metal) may undergo CMP using, for instance, a slurry (e.g., fumed silica-based, dispersed silica, fumed or dispersed alumina, etc.). Such CMP is well-known to those skilled in the art. As a result of the CMP process, the surface of the wafers is covered with particles (e.g., slurry residue).

Thus, a method and apparatus for cleaning the side-edge and top-edge of semiconductor wafers is disclosed.

We claim:

1. An apparatus for cleaning a top-edge and a side-edge of a wafer, said apparatus comprising:

a first roller that rotates said wafer about a first axis of rotation at a first speed;

a second roller that rotates about a second axis of rotation at a second speed different than said first speed, said second axis of rotation being substantially parallel to said first axis of rotation, said second roller further comprising a first external surface that is coaxial with said second axis of rotation and a second external surface that is substantially perpendicular to said first external surface, said first and second external surfaces forming a corner region at a juncture between the two surfaces, said first and second external surfaces comprising an abrasive material for cleaning said top-edge and said side-edge of said wafer due to a difference in tangential velocity at the contact points between the said abrasive material and said top-edge and said side-edge of said wafer.

2. The apparatus of claim 1 wherein said first roller comprises an abrasive material.

3. The apparatus of claim 1 wherein said abrasive material comprises a pad on said second roller.

4. The apparatus of claim 1 wherein said abrasive material comprises a pad on said first roller.

5. The apparatus of claim 1 wherein said abrasive material comprises poly vinyl alcohol.

6. The apparatus of claim 1 wherein said abrasive material comprises nylon.

7. The apparatus of claim 1 wherein said abrasive material comprises polyurethane.

8. The apparatus of claim 1 further comprising a water jet propelling water at the points of contacts between said abrasive material and said wafer.

9. The apparatus of claim 1 further comprising a jet propelling at least one chemical at the points of contact between said abrasive material and said wafer.

10. The apparatus of claim 9 wherein said at least one chemical comprises $NH_4OH$.

11. The apparatus of claim 9 wherein said at least one chemical comprises $NH_4OH/H_2O_2$.

* * * * *